US012563673B2

(12) United States Patent
Komiyama et al.

(10) Patent No.: US 12,563,673 B2
(45) Date of Patent: Feb. 24, 2026

(54) SEMICONDUCTOR MODULE

(71) Applicant: FUJI ELECTRIC CO., LTD.,
Kawasaki (JP)

(72) Inventors: Norihiro Komiyama, Matsumoto (JP);
Masahiro Sasaki, Azumino (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 386 days.

(21) Appl. No.: 18/453,579

(22) Filed: Aug. 22, 2023

(65) Prior Publication Data

US 2024/0137015 A1    Apr. 25, 2024
US 2024/0235540 A9    Jul. 11, 2024

(30) Foreign Application Priority Data

Oct. 21, 2022    (JP) ................................. 2022-169264

(51) Int. Cl.
*H05K 1/181*        (2026.01)
*H03K 17/081*        (2006.01)
(52) U.S. Cl.
CPC ....... *H05K 1/181* (2013.01); *H03K 17/08116*
(2013.01); *H05K 2201/10166* (2013.01)
(58) Field of Classification Search
CPC ............. H05K 1/18; H05K 1/181–184; H05K
2201/10166; H01L 23/00; H01L 23/007;
H01L 23/495; H01L 23/498; H01L
23/49811; H01L 23/49844; H01L 23/538;
H01L 23/5386; H01L 24/45; H01L
24/48–49; H01L 25/072; H01L 25/18

USPC ................ 361/767–778, 782–784, 803, 813;
257/668–685
See application file for complete search history.

(56) References Cited

U.S. PATENT DOCUMENTS 5,471,089 A * 11/1995 Nagatomo .............. H01L 24/06
257/E23.079
6,552,429 B2 * 4/2003 Arai ........................ H01L 24/49
257/584

(Continued)

FOREIGN PATENT DOCUMENTS

JP        2017135321 A        8/2017
JP        2017162884 A        9/2017
WO        2020054806 A1        3/2020

*Primary Examiner* — Tuan T Dinh
(74) *Attorney, Agent, or Firm* — Rabin & Berdo, P.C.

(57) ABSTRACT

A semiconductor module, including: a first circuit board and
a second circuit board respectively have a first switching
element and a second switching element located thereon,
each of the first and second switching elements having an
emitter electrode; a first connecting portion and a second
connecting portion respectively electrically connected to the
emitter electrodes of the first and second switching elements
over the first and second circuit boards; an auxiliary emitter
terminal; and an auxiliary emitter wiring electrically con-
nected to the auxiliary emitter terminal. The auxiliary emit-
ter wiring includes: a branch point, a common wiring portion
which connects the auxiliary emitter terminal and the branch
point, and a first discrete wiring portion and a second
discrete wiring portion which connect the branch point
respectively to the first and second connecting portions, and
which each have an inductance smaller than 10 percent of an
inductance of the common wiring portion.

4 Claims, 11 Drawing Sheets

(56) References Cited

U.S. PATENT DOCUMENTS

| | | | |
|---|---|---|---|
| 2006/0086981 A1* | 4/2006 | Yamaguchi | H02M 7/003 |
| | | | 257/347 |
| 2006/0290689 A1* | 12/2006 | Grant | H01L 24/49 |
| | | | 257/734 |
| 2016/0190915 A1* | 6/2016 | Horiuchi | H01L 25/072 |
| | | | 363/132 |
| 2020/0395344 A1 | 12/2020 | Horie et al. | |
| 2021/0280555 A1* | 9/2021 | Murata | H01L 24/49 |
| 2022/0238493 A1* | 7/2022 | Schroeder | H01L 23/5385 |

* cited by examiner

CHANGE IN PHASE
MARGIN [deg]

RELATIVE VALUE
(Lae/Lam)

SLOPE OF GRAPH OF
PHASE MARGINS

RELATIVE VALUE
(Lae/Lam)

SEMICONDUCTOR MODULE

CROSS-REFERENCE TO RELATED APPLICATION

This application is based upon and claims the benefit of priority of the prior Japanese Patent Application No. 2022-169264, filed on Oct. 21, 2022, the entire contents of which are incorporated herein by reference.

BACKGROUND OF THE INVENTION

1. Field of the Invention

The embodiment discussed herein relates to a semiconductor module including a plurality of switching elements.

2. Background of the Related Art

Semiconductor modules including switching elements, such as insulated gate bipolar transistors (IGBTs) or power metal oxide semiconductor field effect transistors (MOSFETs), are used in power converters and the like in which a high voltage and a strong current are used.

For example, a semiconductor module for power conversion including IGBTs has an upper arm and a lower arm each of which is made up of an IGBT and a diode (which functions as a free wheeling diode (FWD)). The IGBT of the upper arm and the IGBT of the lower arm are connected in series. Furthermore, in each of the upper arm and the lower arm, a set of the IGBT and the diode are connected in parallel. By doing so, current capacity as the semiconductor module is enlarged.

With a structure in which switching elements are connected in parallel, an oscillation phenomenon (hereinafter referred to as a gate oscillation) may be observed in a gate voltage at switching operation time or arm short-circuit time. A gate oscillation is caused by a gate capacitance of a switching element, inductance between the switching elements connected in parallel, inductance between the gates, or the like. When a gate oscillation occurs, a voltage higher than a breakdown voltage may be applied to a gate terminal of a switching element. Accordingly, various measures are taken.

The following are proposed as related arts. For example, the inductance of a path between emitter electrodes (terminals) of IGBTs connected in parallel and a connection point of them along which a main current flows is made smaller than inductance between the emitter electrodes such as the inductance of a board. By doing so, a gate oscillation is suppressed (see, for example, Japanese Laid-open Patent Publication No. 2017-162884). Furthermore, inductance is made equal by adjusting the length or number of wires connected to emitters of a plurality of IGBTs. By doing so, a current imbalance or oscillation is suppressed (see, for example, Japanese Laid-open Patent Publication No. 2017-135321, paragraph etc.).

On the other hand, there are provided semiconductor devices in which a plurality of IGBTs that belong to the same arm are located over different boards and are connected in parallel via conductive patterns or the like. With such semiconductor devices, inductance caused by the conductive patterns or the like which connect emitter electrodes increases and it may be that an oscillation phenomenon is not sufficiently suppressed. Accordingly, the emitter electrodes of the plurality of IGBTs that belong to the same arm are connected directly by a conductor wire to uniformize potentials of the emitter electrodes. By doing so, a gate oscillation is suppressed (see, for example, International Publication Pamphlet No. WO 2020/054806).

The above semiconductor module has a structure in which a set of an IGBT and a diode are mounted over a direct copper bonding (DCB) substrate and in which DCB substrates are connected in parallel. However, with an increase in the number of DCB substrates, a gate oscillation is more likely to occur at the time of switching of an IGBT or a short circuit state.

With the above structure, a chip resistor may be connected onto a gate wiring of an IGBT to suppress a gate oscillation. However, if a chip resistor is connected, then delay occurs in the rising of a gate signal, switching time lengthens, and turn-on loss increases. In addition, the number of parts increases. This leads to an increase in product cost.

There is a danger that a gate oscillation may lead to noise generation or breakage of a gate oxide film. Accordingly, with a semiconductor module including a plurality of DCB substrates, a technique for suppressing gate oscillation with accuracy while suppressing turn-on loss or an increase in costs is desired.

SUMMARY OF THE INVENTION

According to an aspect, there is provided a semiconductor module including: a first circuit board; a first switching element located on the first circuit board, the first switching element having an emitter electrode; a second circuit board; a second switching element located on the second circuit board and connected in parallel with the first switching element, the second switching element having an emitter electrode; an auxiliary emitter terminal; a first connecting portion electrically connected to the emitter electrode of the first switching element over the first circuit board; a second connecting portion electrically connected to the emitter electrode of the second switching element over the second circuit board; and an auxiliary emitter wiring electrically connected to the auxiliary emitter terminal, the auxiliary emitter wiring including: a branch point, a common wiring portion which connects the auxiliary emitter terminal and the branch point, a first discrete wiring portion which connects the branch point and the first connecting portion, and which has an inductance smaller than 10 percent of an inductance of the common wiring portion, and a second discrete wiring portion which connects the branch point and the second connecting portion, and which has an inductance smaller than 10 percent of the inductance of the common wiring portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described with reference to the accompanying drawings. Components in the specification and the drawings having virtually the same structure are marked with the same numeral. By doing so, a duplicate description may be omitted.

Figure 1:
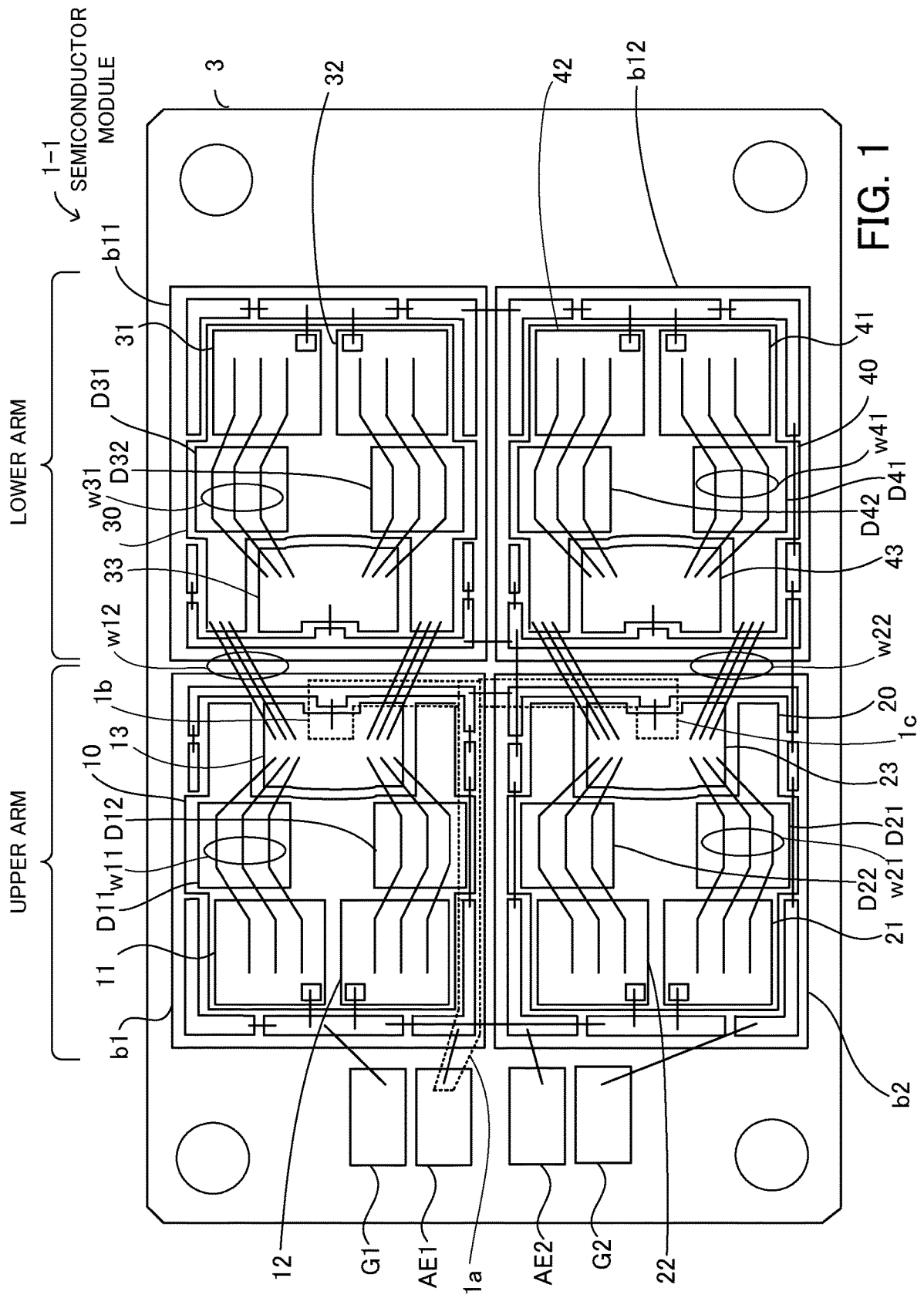
FIG. 1 illustrates an example of the structure of a semiconductor module according to an embodiment.

FIG. 1 illustrates an example of the structure of a semiconductor module according to an embodiment. FIG. 1 is a plan view of a semiconductor module 1-1 according to an embodiment. With the semiconductor module 1-1, circuit boards b1 and b2 are mounted on the upper arm side of a base plate 3 and circuit boards b11 and b12 are mounted on the lower arm side of the base plate 3. Furthermore, auxiliary emitter terminals AE1 and AE2 and gate terminals G1 and G2 are mounted over the base plate 3. For example, the circuit boards b1, b2, b11, and b12 are DCB substrates.

IGBTs 11 and 12, which are switching elements, are located over a conductive pattern 10 arranged over a principal plane of the circuit board b1. Furthermore, a diode D11 which functions as an FWD with respect to the IGBT 11 and a diode D12 which functions as an FWD with respect to the IGBT 12 are located over the conductive pattern 10 of the circuit board b1.

IGBTs 21 and 22, which are switching elements, are located over a conductive pattern 20 arranged over a principal plane of the circuit board b2. Furthermore, a diode D21 which functions as an FWD with respect to the IGBT 21 and a diode D22 which functions as an FWD with respect to the IGBT 22 are located over the conductive pattern 20 of the circuit board b2.

IGBTs 31 and 32, which are switching elements, are located over a conductive pattern 30 arranged over a principal plane of the circuit board b11. Furthermore, a diode D31 which functions as an FWD with respect to the IGBT 31 and a diode D32 which functions as an FWD with respect to the IGBT 32 are located over the conductive pattern 30 of the circuit board b11.

IGBTs 41 and 42, which are switching elements, are located over a conductive pattern 40 arranged over a principal plane of the circuit board b12. Furthermore, a diode D41 which functions as an FWD with respect to the IGBT 41 and a diode D42 which functions as an FWD with respect to the IGBT 42 are located over the conductive pattern 40 of the circuit board b12.

On the other hand, a connecting portion 13, which is another conductive pattern, is arranged in a space over the circuit board b1 formed by cutting off part of the conductive pattern 10 and a connecting portion 23, which is another conductive pattern, is arranged in a space over the circuit board b2 formed by cutting off part of the conductive pattern 20.

Furthermore, a connecting portion 33, which is another conductive pattern, is arranged in a space over the circuit board b11 formed by cutting off part of the conductive pattern 30 and a connecting portion 43, which is another conductive pattern, is arranged in a space over the circuit board b12 formed by cutting off part of the conductive pattern 40.

Emitters of the IGBTs 11 and 12 located over the conductive pattern 10 of the circuit board b1 are connected via conductor wires w11 to anodes of the diodes D11 and D12, respectively, adjacent thereto and are connected via the conductor wires w11 to the connecting portion 13. Furthermore, the connecting portion 13 is connected via conductor wires w12 to the conductive pattern 30 of the circuit board b11.

Emitters of the IGBTs 21 and 22 located over the conductive pattern 20 of the circuit board b2 are connected via conductor wires w21 to anodes of the diodes D21 and D22, respectively, adjacent thereto and are connected via the conductor wires w21 to the connecting portion 23. Furthermore, the connecting portion 23 is connected via conductor wires w22 to the conductive pattern 40 of the circuit board b12.

Emitters of the IGBTs 31 and 32 located over the conductive pattern 30 of the circuit board b11 are connected via conductor wires w31 to anodes of the diodes D31 and D32, respectively, adjacent thereto and are connected via the conductor wires w31 to the connecting portion 33.

Emitters of the IGBTs 41 and 42 located over the conductive pattern 40 of the circuit board b12 are connected via conductor wires w41 to anodes of the diodes D41 and D42, respectively, adjacent thereto and are connected via the conductor wires w41 to the connecting portion 43.

Figure 2:
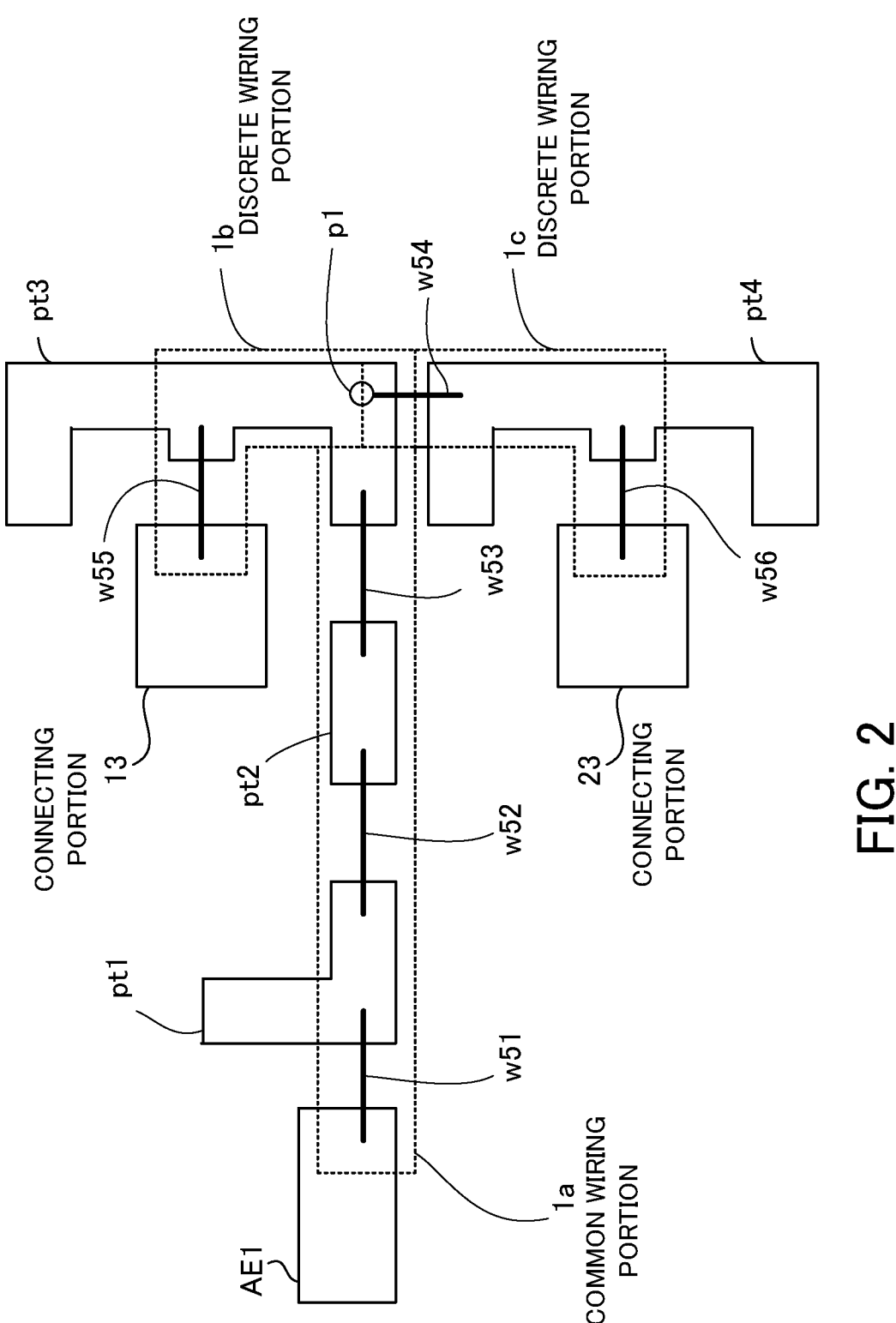
FIG. 2 illustrates an example of the structure of an auxiliary emitter wiring on an upper arm side.

FIG. 2 illustrates an example of the structure of an auxiliary emitter wiring on an upper arm side. In the semiconductor module 1-1, the auxiliary emitter terminal AE1 is connected via a conductor wire w51 to a conductive pattern pt1 arranged over the circuit board b1.

The conductive pattern pt1 is connected via a conductor wire w52 to a conductive pattern pt2 arranged over the circuit board b1. The conductive pattern pt2 is connected via a conductor wire w53 to a conductive pattern pt3 arranged over the circuit board b1. The conductive pattern pt3 is connected via a conductor wire w54 to a conductive pattern pt4 arranged over the circuit board b2.

Furthermore, the connecting portion 13 arranged over the circuit board b1 is connected via a conductor wire w55 to the conductive pattern pt3 and the connecting portion 23 arranged over the circuit board b2 is connected via a conductor wire w56 to the conductive pattern pt4.

An auxiliary emitter wiring connected to the auxiliary emitter terminal AE1 on the upper arm side includes a common wiring portion 1a and discrete wiring portions 1b and 1c. The common wiring portion 1a connects the auxiliary emitter terminal AE1 and a branch point p1. Furthermore, the discrete wiring portion 1b connects the branch point p1 and the connecting portion 13 and the discrete wiring portion 1c connects the branch point p1 and the connecting portion 23.

In this case, the common wiring portion 1a extends from the auxiliary emitter terminal AE1, through the conductor wire w51, the conductive pattern pt1, the conductor wire w52, the conductive pattern pt2, and the conductor wire w53, to the branch point p1 on the conductive pattern pt3. Furthermore, the discrete wiring portion 1b extends from the branch point p1, through the conductive pattern pt3 and the conductor wire w55, to the connecting portion 13. In addition, the discrete wiring portion 1c extends from the branch point p1, through the conductive pattern pt4 and the conductor wire w56, to the connecting portion 23.

In the above description, an IGBT is used as a switching element. However, a switching element other than an IGBT may be used. For example, a MOSFET may be used in place of an IGBT. Furthermore, an element formed in a wide-band-gap semiconductor substrate, such as a silicon carbide (SiC) substrate, may be used. If a MOSFET is used, then an "emitter" and a "collector" are replaced with a "source" and a "drain", respectively. In addition, a discrete diode may be omitted by, for example, using a reverse conducting IGBT (RC-IGBT) in which a diode is formed inside a switching element.

The conductive patterns 10, 20, 30, and 40 arranged over the circuit boards b1, b2, b11, and b12 respectively, the conductive patterns pt1, pt2, pt3, and pt4 arranged over the circuit boards b1, b2, b11, and b12, and the connecting portions 13, 23, 33, and 43 arranged over the circuit boards b1, b2, b11, and b12 respectively are made of a material, such as copper, aluminum, or an alloy containing at least one of them, having good electrical conductivity. For example, the thickness of the conductive patterns 10, 20, 30, and 40, the conductive patterns pt1, pt2, pt3, and pt4, and the connecting portions 13, 23, 33, and 43 is 0.2 mm.

Furthermore, electronic parts other than switching elements and diodes may properly be arranged over the conductive patterns 10, 20, 30, and 40. The arrangement position and shape of the conductive patterns 10, 20, 30, and 40, the conductive patterns pt1, pt2, pt3, and pt4, and the connecting portions 13, 23, 33, and 43 may properly be selected by design.

One or a combination of gold, copper, aluminum, a gold alloy, a copper alloy, and an aluminum alloy may be used as the conductor wires w11, w12, w21, w22, w31, w41, w51, w52, w53, w54, w55, and w56 which are wiring members. Wire bonding by ultrasonic waves and loading is performed as bonding using conductor wires.

Figure 3:
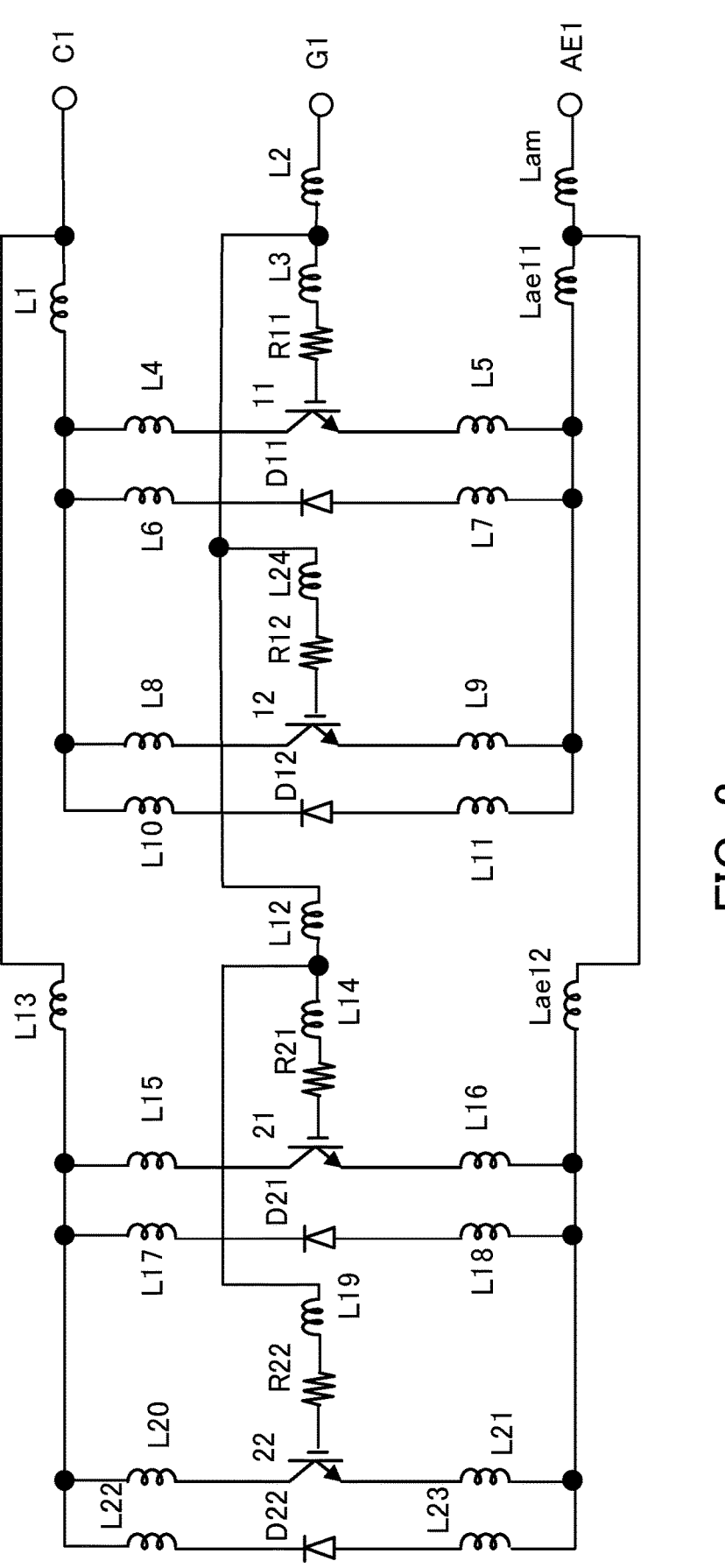
FIG. 3 illustrates an equivalent circuit of the semiconductor module on the upper arm side.

FIG. 3 illustrates an equivalent circuit of the semiconductor module on the upper arm side. This equivalent circuit includes IGBTs 11, 12, 21, and 22, diodes D11, D12, D21, and D22, and resistors R11, R12, R21, and R22.

Furthermore, it is assumed that the inductance (parasitic inductance) of conductive patterns and conductor wires are inductors L1 through L24, that the inductance of the common wiring portion 1a is an inductor Lam, the inductance of the discrete wiring portion 1b is an inductor Lae11, and that the inductance of the discrete wiring portion 1c is an inductor Lae12.

An emitter of the IGBT 11 is connected to one end of the inductor L5 and an anode of the diode D11 is connected to one end of the inductor L7. An emitter of the IGBT 12 is connected to one end of the inductor L9 and an anode of the diode D12 is connected to one end of the inductor L11.

The auxiliary emitter terminal AE1 is connected to one end of the inductor Lam. The other end of the inductor Lam is connected to one end of the inductor Lae11 and one end of the inductor Lae12. The other end of the inductor Lae11 is connected to the other end of the inductor L5, the other end of the inductor L7, the other end of the inductor L9, and the other end of the inductor L11.

An emitter of the IGBT 21 is connected to one end of the inductor L16 and an anode of the diode D21 is connected to one end of the inductor L18. An emitter of the IGBT 22 is connected to one end of the inductor L21 and an anode of the diode D22 is connected to one end of the inductor L23. The other end of the inductor Lae12 is connected to the other end of the inductor L16, the other end of the inductor L18, the other end of the inductor L21, and the other end of the inductor L23.

Hereinafter, the inductance of the inductor Lam of the common wiring portion 1a may be referred to as inductance Lam and the inductance of the inductor Lae11 of the discrete wiring portion 1b and the inductance of the inductor Lae12 of the discrete wiring portion 1c may generically be referred to as inductance Lae.

Figure 4:
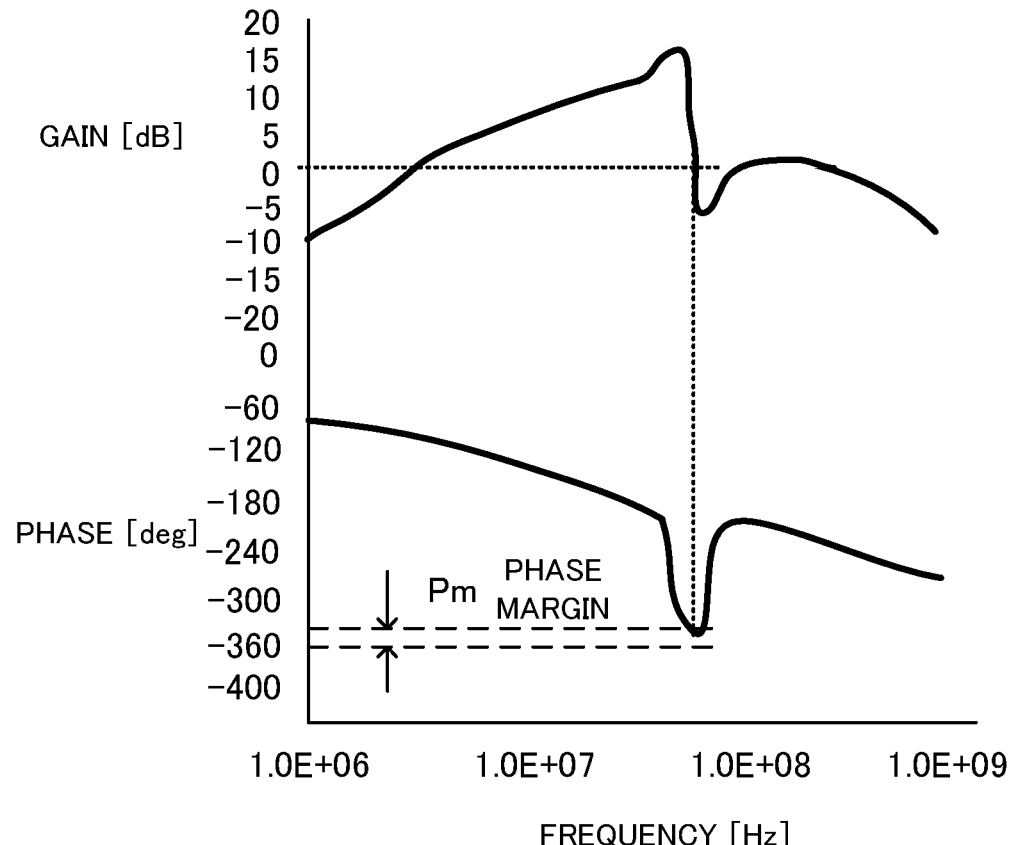
FIG. 4 is a view for describing a phase margin.

FIG. 4 is a view for describing a phase margin. AC analysis used for stability analysis of an operational amplifier or the like may be used as a method for confirming likelihood of a gate oscillation. FIG. 4 illustrates an example of results obtained by performing AC analysis of the semiconductor module. In FIG. 4, a horizontal axis indicates frequencies (Hz) and a vertical axis indicates gain (dB) and phases (deg).

A phase margin is a characteristic value for determining likelihood of a gate oscillation. A phase margin Pm is a value obtained by subtracting −360° from a phase at a frequency at which gain is 0 dB (amplification factor is 1). As the phase margin Pm becomes larger, a gate oscillation is less likely to occur. That is to say, a stable characteristic is obtained.

Figure 5A:
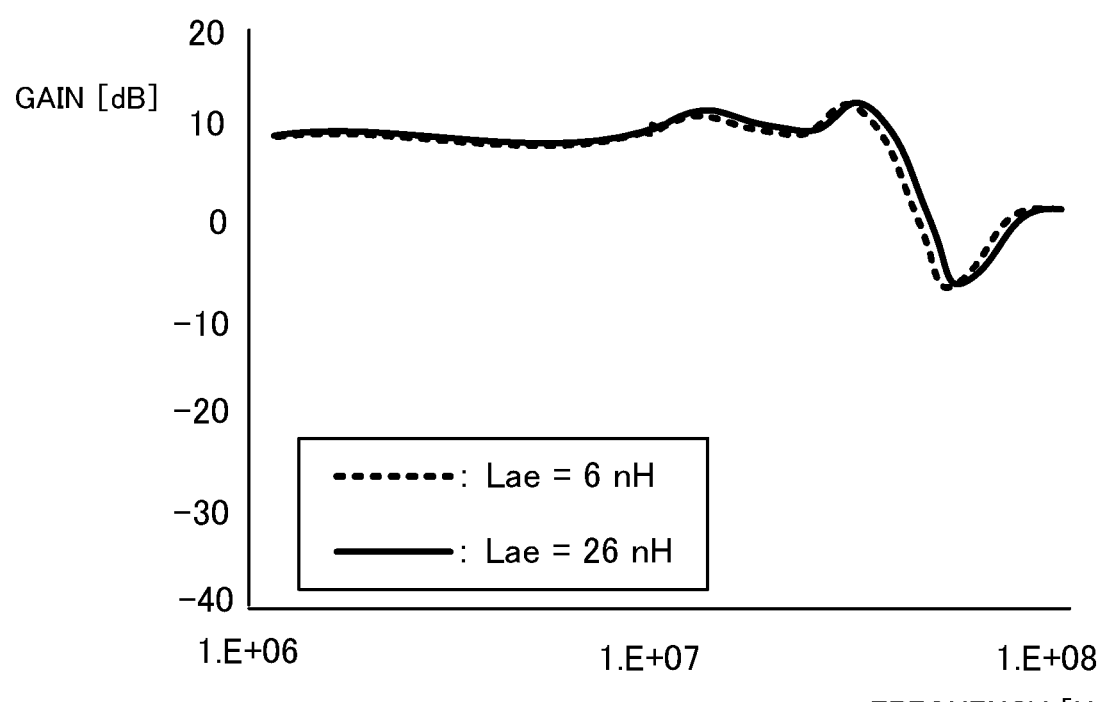
FIGS. 5A and 5B illustrate examples of a change in phase margin obtained when the inductance of discrete wiring portions is changed.
Figure 5B:
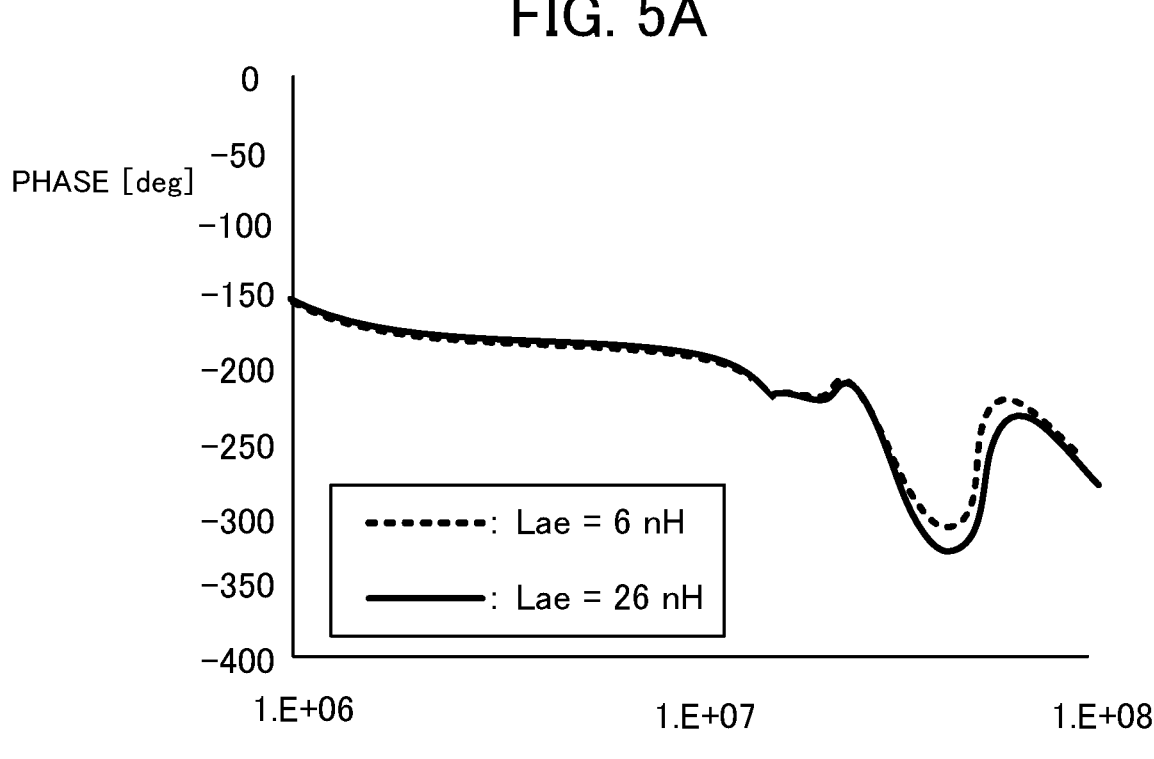

FIGS. 5A and 5B illustrate examples of a change in phase margin obtained at the time of a change in the inductance of the discrete wiring portions. It is assumed that the inductance Lam of the common wiring portion is 65 nH. FIGS. 5A and 5B illustrate simulation results of AC analysis obtained at the time of a change in the inductance Lae of the discrete wiring portions. In FIGS. 5A and 5B, a horizontal axis indicates frequencies (Hz) and a vertical axis indicates gain (dB) or phases (deg). Furthermore, the waveforms of gain and phases obtained when the inductance Lae is 26 nH are indicated by solid lines and the waveforms of gain and phases obtained when the inductance Lae is 6 nH are indicated by dotted lines.

The following results are obtained as a result of simulations. When the inductance Lae is 26 nH, a phase margin is 37 (deg). When the inductance Lae is 6 nH, a phase margin is 49 (deg).

Figure 6:
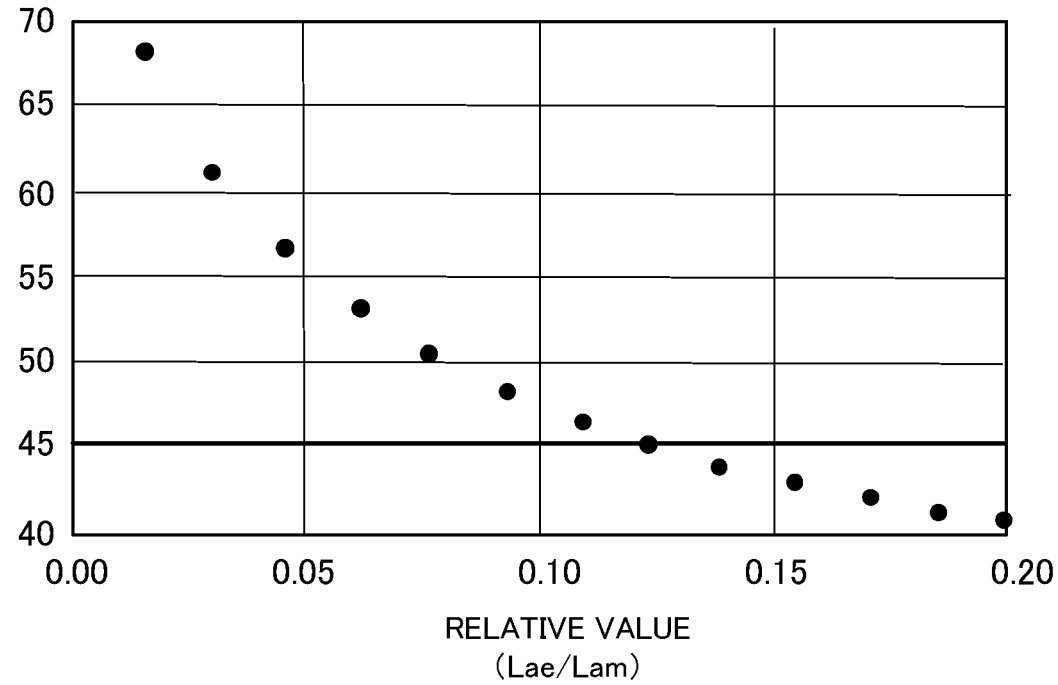
FIG. 6 illustrates an example of the relationship between a relative value and a change in phase margin.

FIG. 6 illustrates an example of the relationship between a relative value and a change in phase margin. In FIG. 6, a horizontal axis indicates a relative value (Lae/Lam) of the inductance Lae of the discrete wiring portions to the inductance Lam of the common wiring portion and a vertical axis indicates phase margins (deg). It turns out from FIG. 6 that as the relative value (Lae/Lam) becomes smaller, a phase margin increases. Furthermore, a phase margin of 45 (deg) or more contributes to stability to gate oscillation.

Figure 7:
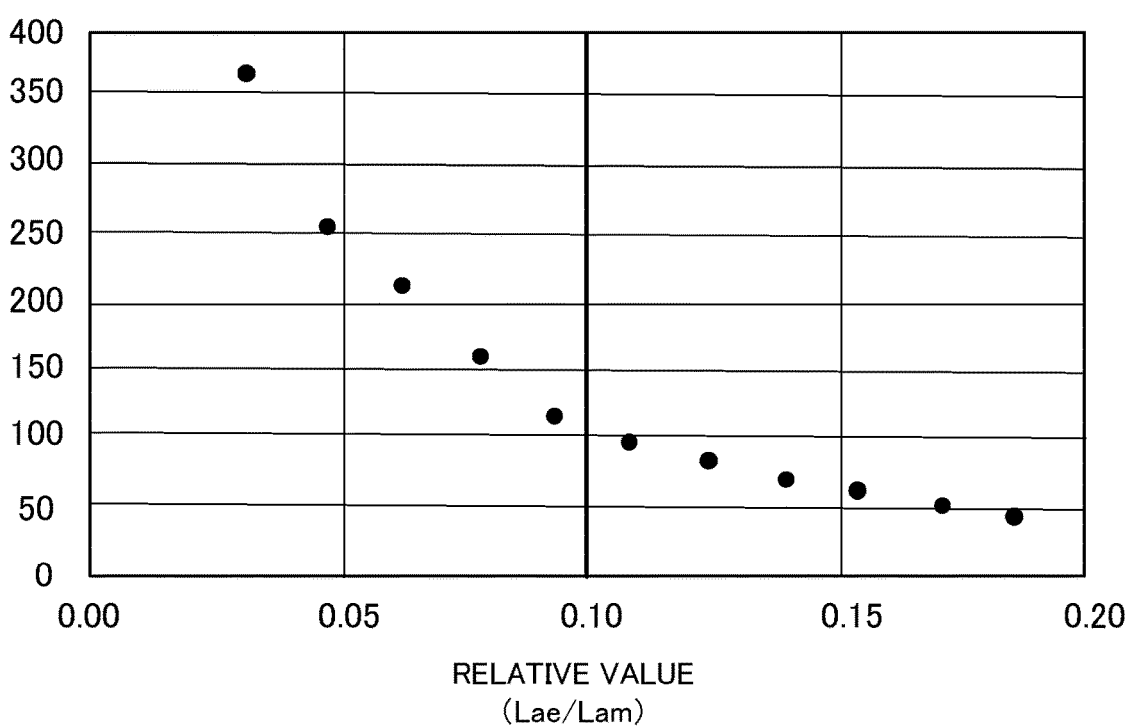
FIG. 7 illustrates an example of the relationship between the relative value and the slope of phase margins.

FIG. 7 illustrates an example of the relationship between the relative value and the slope of a graph of phase margins. In FIG. 7, a horizontal axis indicates the relative value (Lae/Lam) of the inductance Lae of the discrete wiring portions to the inductance Lam of the common wiring portion and a vertical axis indicates the slope of a graph of phase margins.

As illustrated in FIG. 7, as the relative value (Lae/Lam) becomes smaller, a phase margin increases. Furthermore, the slope of the graph of phase margins (rate of an increase in phase margin) becomes steeper at a relative value (Lae/Lam) of about 0.10. It turns out that a phase margin of 45 (deg) or more is obtained by making the relative value (Lae/Lam) smaller than 0.10. The relative value (Lae/Lam) smaller than 0.10 means that the inductance Lae of the discrete wiring portions is smaller than 10 percent of the inductance Lam of the common wiring portion.

As stated above, an adjustment is made so that the inductance Lae of the discrete wiring portions will be smaller than 10 percent of the inductance Lam of the common wiring portion. By doing so, the rate of an increase in phase margin is increased, a phase margin is made larger than or equal to 45 (deg), and gate oscillation is suppressed with accuracy.

Figures 8A, 8B:
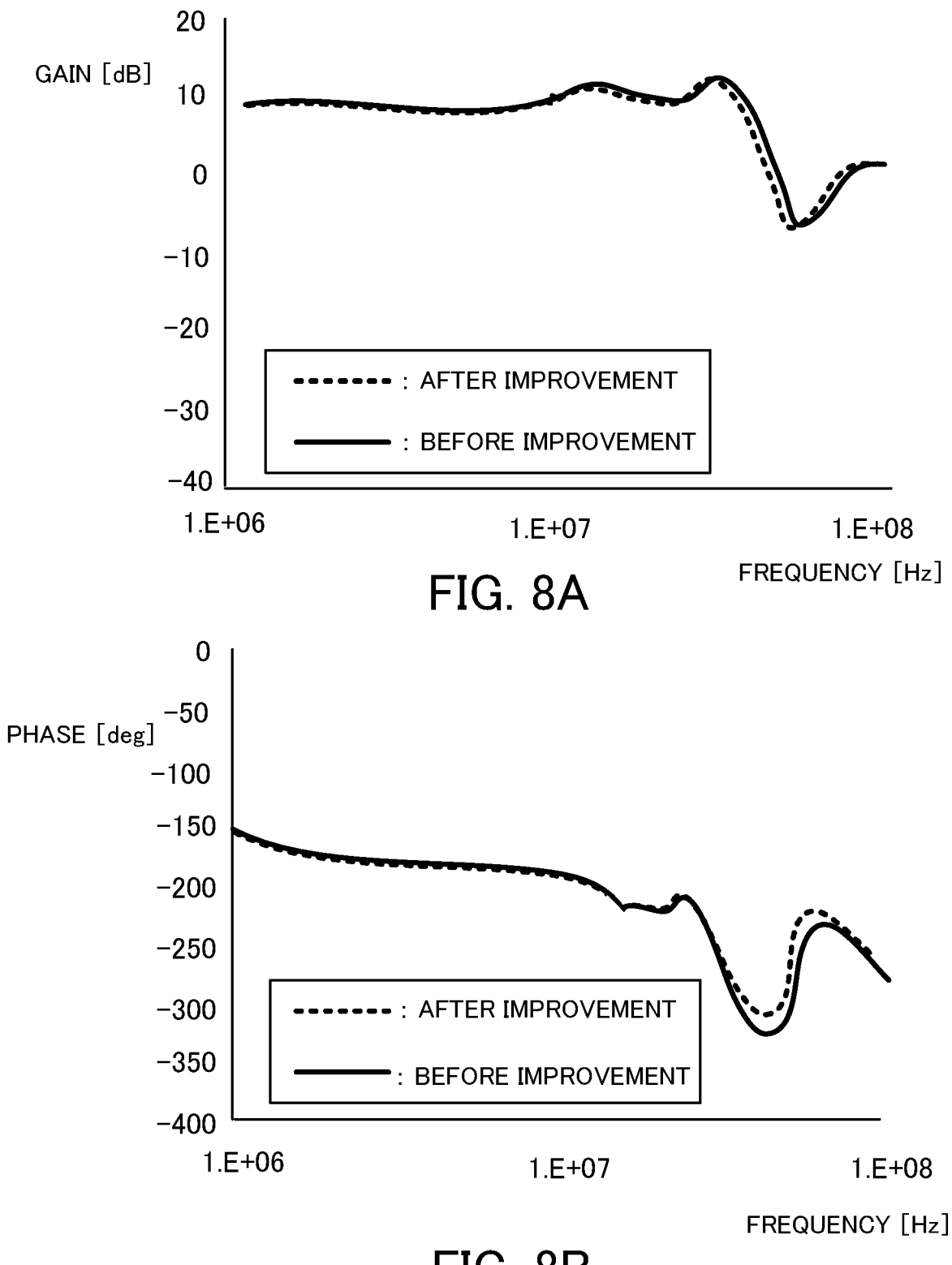
FIGS. 8A and 8B illustrate examples of results obtained by improving a phase margin.

FIGS. 8A and 8B illustrate examples of results obtained by improving a phase margin. FIGS. 8A and 8B illustrate simulation results of AC analysis obtained at the time of a change in the relative value (Lae/Lam) of the inductance Lae of the discrete wiring portions 1b and 1c to the inductance Lam of the common wiring portion 1a in the semiconductor module 1-1. In FIGS. 8A and 8B, a horizontal axis indicates frequencies (Hz) and a vertical axis indicates gain (dB) or phases (deg). Furthermore, the waveform of gain or phases before improvement is indicated by a solid line and the waveform of gain or phases after improvement is indicated by a dotted line.

Before improvement, the inductance Lam of the common wiring portion 1a is 65 nH, the inductance Lae of the discrete wiring portions 1b and 1c is 13 nH, and a phase margin is 41 (deg).

On the other hand, after improvement, if the inductance Lam of the common wiring portion 1a is set to 73 nH and the inductance Lae of the discrete wiring portions 1b and 1c is set to 5 nH smaller than 10 percent of 73 nH, then a phase margin is 51 (deg).

By making in this way the inductance Lae of the discrete wiring portions smaller than 10 percent of the inductance Lam of the common wiring portion, the rate of an increase in phase margin is increased, a phase margin is made larger than or equal to 45 (deg), and gate oscillation is suppressed with accuracy.

Figure 9:
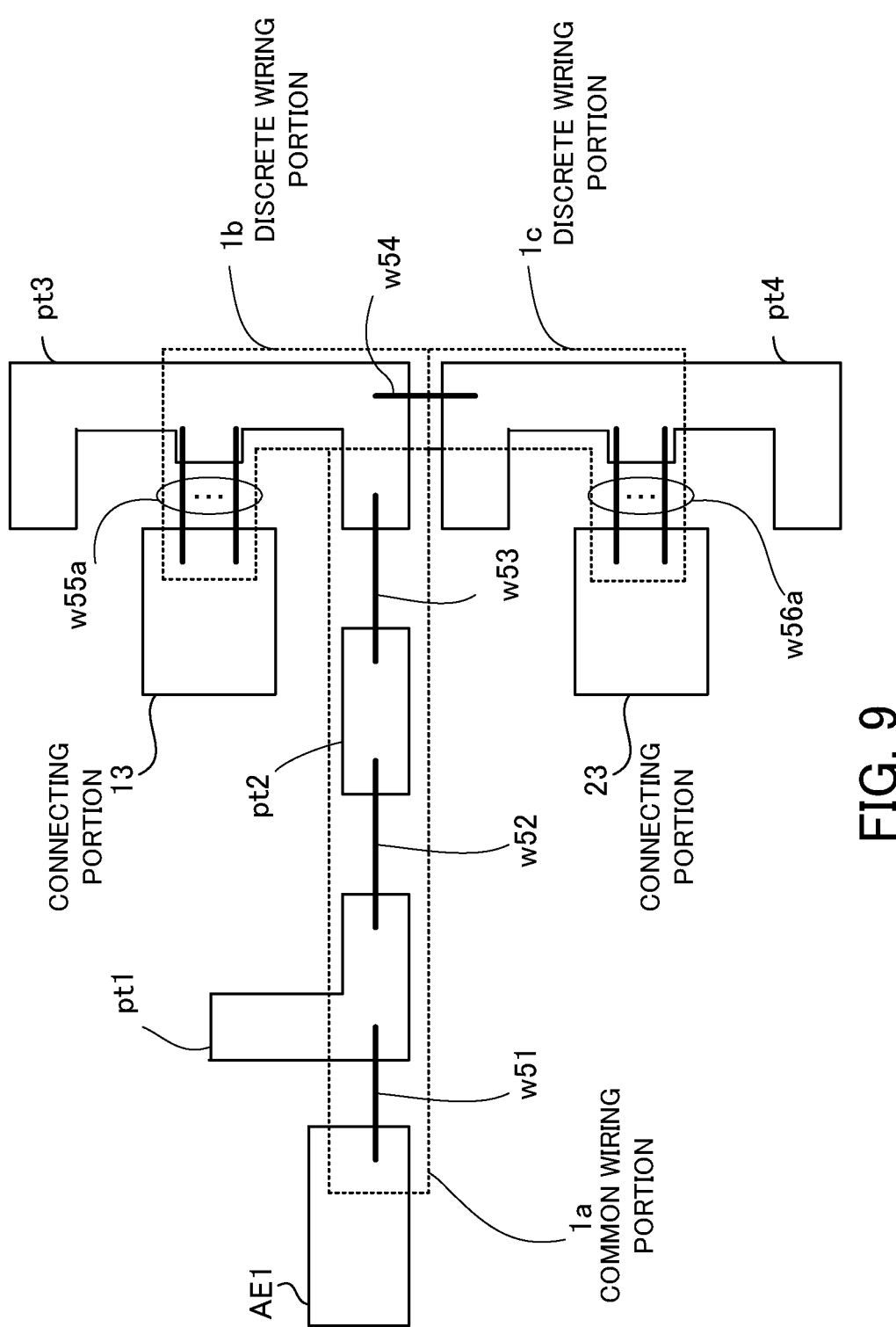
FIG. 9 illustrates an example of a state in which the discrete wiring portions and connecting portions are connected on the upper arm side.

FIG. 9 illustrates an example of a state in which the discrete wiring portions and the connecting portions are connected on the upper arm side. With the discrete wiring portion 1b, the conductive pattern pt3 and the connecting portion 13 are connected by a plurality of conductor wires w55a. With the discrete wiring portion 1c, the conductive pattern pt4 and the connecting portion 23 are connected by a plurality of conductor wires w56a.

If this structure is adopted, then the number of the conductor wires w55a is changed. By doing so, an adjustment is made so that the inductance Lae11 of the discrete wiring portion 1b will be smaller than 10 percent of the inductance Lam of the common wiring portion 1a. Furthermore, the number of the conductor wires w56a is changed. By doing so, an adjustment is made so that the inductance Lae12 of the discrete wiring portion 1c will be smaller than 10 percent of the inductance Lam of the common wiring portion 1a. Accordingly, a phase margin is increased and gate oscillation is suppressed.

Figure 10:
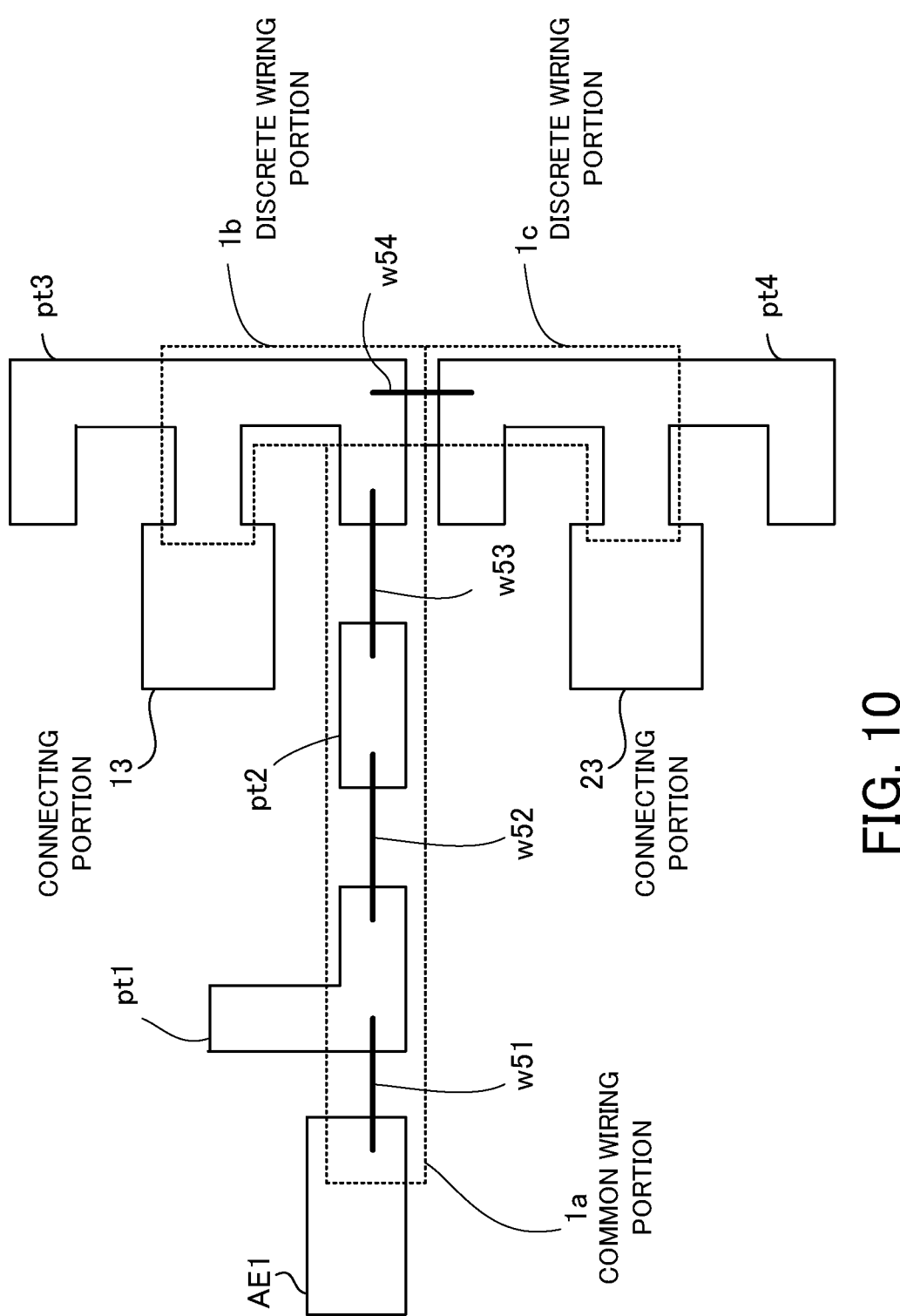
FIG. 10 illustrates an example of a state in which the discrete wiring portions and the connecting portions are connected on the upper arm side.

FIG. 10 illustrates an example of a state in which the discrete wiring portions and the connecting portions are connected on the upper arm side. With the discrete wiring portion 1b, the conductive pattern pt3 is connected directly to the connecting portion 13. With the discrete wiring portion 1c, the conductive pattern pt4 is connected directly to the connecting portion 23.

If this structure is adopted, then the discrete wiring portion 1b is connected directly to the connecting portion 13 by the conductive pattern. By doing so, an adjustment is made so that the inductance Lae11 of the discrete wiring portion 1b will be smaller than 10 percent of the inductance Lam of the common wiring portion 1a. Furthermore, the discrete wiring portion 1c is connected directly to the connecting portion 23 by the conductive pattern. By doing so, an adjustment is made so that the inductance Lae12 of the discrete wiring portion 1c will be smaller than 10 percent of the inductance Lam of the common wiring portion 1a. Accordingly, a phase margin is increased and gate oscillation is suppressed.

Figure 11:
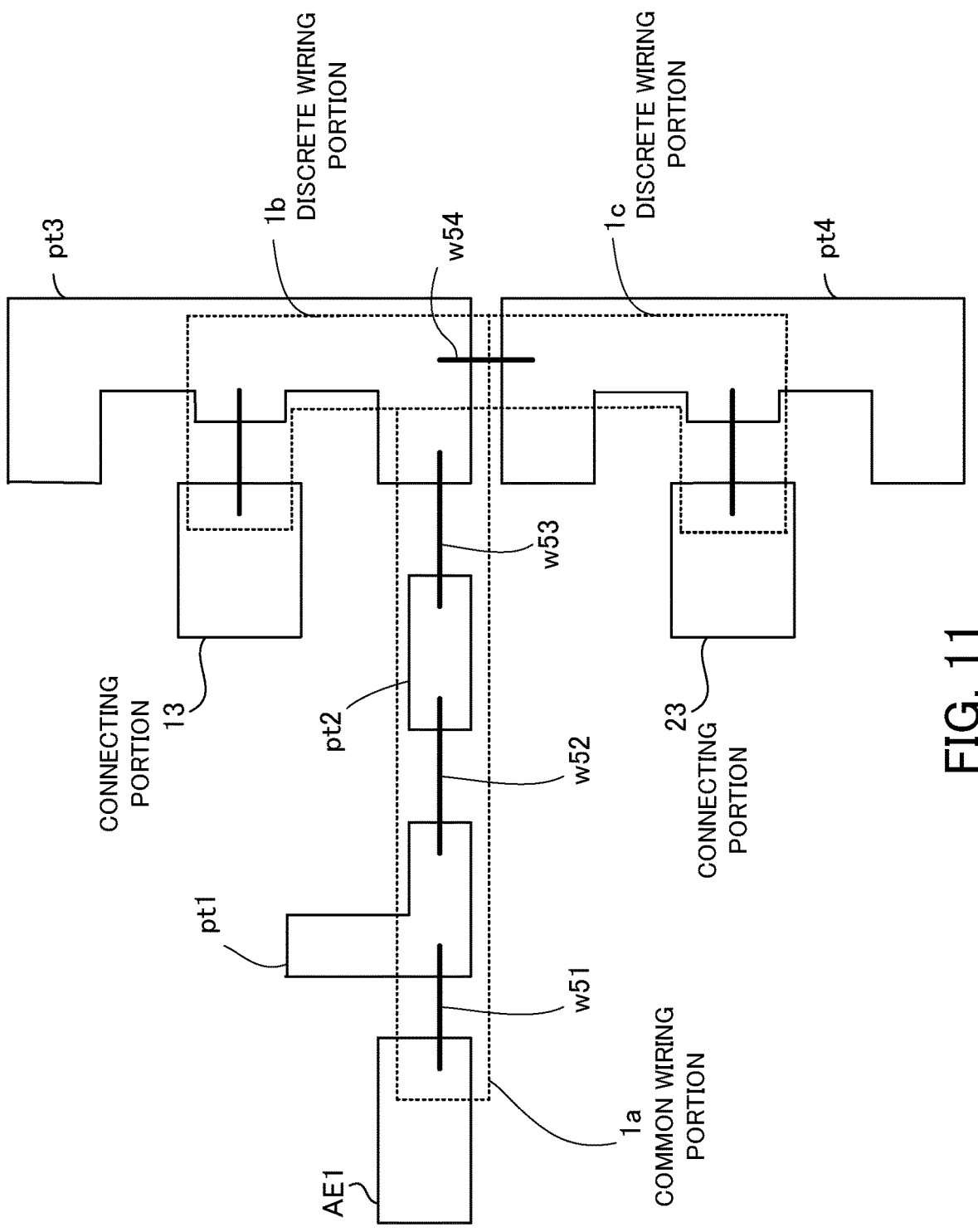
FIG. 11 illustrates an example of a state in which the discrete wiring portions and the connecting portions are connected on the upper arm side.

FIG. 11 illustrates an example of a state in which the discrete wiring portions and the connecting portions are connected on the upper arm side. The width of the conductive pattern pt3 included in the discrete wiring portion 1b is larger than that of the conductive patterns pt1 and pt2 included in the common wiring portion 1a. The width of the conductive pattern pt4 included in the discrete wiring portion 1c is larger than that of the conductive patterns pt1 and pt2 included in the common wiring portion 1a.

If this structure is adopted, then the width of the conductive pattern included in the discrete wiring portion 1b is made larger than that of the conductive patterns included in the common wiring portion 1a. By doing so, an adjustment is made so that the inductance Lae11 of the discrete wiring portion 1b will be smaller than 10 percent of the inductance Lam of the common wiring portion 1a. Furthermore, the width of the conductive pattern included in the discrete wiring portion 1c is made larger than that of the conductive patterns included in the common wiring portion 1a. By doing so, an adjustment is made so that the inductance Lae12 of the discrete wiring portion 1c will be smaller than 10 percent of the inductance Lam of the common wiring portion 1a. Accordingly, a phase margin is increased and gate oscillation is suppressed.

As has been described in the foregoing, the semiconductor module according to the present disclosure has an auxiliary emitter wiring including a common wiring portion from an auxiliary emitter terminal to a branch point at which there is a branch to each circuit board and a discrete wiring portion from the branch point to a connecting portion located over each circuit board. An adjustment is made to decrease an inductance value of each discrete wiring portion having high sensitivity to gate oscillation. In this case, an adjustment is made so that each discrete wiring portion will have inductance smaller than 10 percent of that of the common wiring portion. This increases a phase margin, suppresses gate oscillation, and improves the stability of operation, while suppressing turn-on loss or an increase in costs. In the foregoing, the structure of the auxiliary emitter wiring on the upper arm side has been described. However, the same structure may be adopted for an auxiliary emitter wiring on the lower arm side.

The embodiments have been taken as an example. The structure of each section indicated in each embodiment may be replaced by another structure having the same function. Furthermore, any other component or process may be added. Moreover, the structures (features) of any two or more of the above embodiments may be combined.

According to an aspect, gate oscillation is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module, comprising:

a first circuit board;

a first switching element located on the first circuit board, the first switching element having an emitter electrode;

a second circuit board;

a second switching element located on the second circuit board and connected in parallel with the first switching element, the second switching element having an emitter electrode;

an auxiliary emitter terminal;

a first connecting portion electrically connected to the emitter electrode of the first switching element over the first circuit board;

a second connecting portion electrically connected to the emitter electrode of the second switching element over the second circuit board; and an auxiliary emitter wiring electrically connected to the auxiliary emitter terminal, the auxiliary emitter wiring including:

a branch point, a common wiring portion which connects the auxiliary emitter terminal and the branch point, a first discrete wiring portion which connects the branch point and the first connecting portion, and which has an inductance smaller than 10 percent of an inductance of the common wiring portion, and a second discrete wiring portion which connects the branch point and the second connecting portion, and which has an inductance smaller than 10 percent of the inductance of the common wiring portion.

2. The semiconductor module according to claim 1, wherein the first discrete wiring portion and the first connecting portion, or the second discrete wiring portion and the second connecting portion, are electrically connected by a plurality of conductive wires.

3. The semiconductor module according to claim 1, wherein the first discrete wiring portion and the first connecting portion, or the second discrete wiring portion and the second connecting portion, are connected directly by a conductive pattern.

4. The semiconductor module according to claim 1, wherein a wiring width of the first discrete wiring portion, or a wiring width of the second discrete wiring portion, is larger than a wiring width of the common wiring portion.

* * * * *